(12) United States Patent
Lin

(10) Patent No.: US 12,224,232 B2
(45) Date of Patent: Feb. 11, 2025

(54) SEMICONDUCTOR PACKAGE HAVING SIDE WALL PLATING

(71) Applicant: SILICONIX INCORPORATED, San Jose, CA (US)

(72) Inventor: Barry Lin, Kaohsiung (TW)

(73) Assignee: SILICONIX INCORPORATED

(*) Notice: Subject to any disclaimer, the term of this patent is extended or adjusted under 35 U.S.C. 154(b) by 581 days.

(21) Appl. No.: 17/436,454

(22) PCT Filed: Mar. 8, 2019

(86) PCT No.: PCT/US2019/021272
§ 371 (c)(1),
(2) Date: Sep. 3, 2021

(87) PCT Pub. No.: WO2020/185192
PCT Pub. Date: Sep. 17, 2020

(65) Prior Publication Data
US 2022/0181239 A1  Jun. 9, 2022

(51) Int. Cl.
*H01L 21/56* (2006.01)
*H01L 23/00* (2006.01)
(Continued)

(52) U.S. Cl.
CPC ...... *H01L 23/49582* (2013.01); *H01L 21/561* (2013.01); *H01L 23/3114* (2013.01);
(Continued)

(58) Field of Classification Search
CPC ........... H01L 23/49582; H01L 23/3114; H01L 23/49541; H01L 23/49562; H01L 23/3107;
(Continued)

(56) References Cited

U.S. PATENT DOCUMENTS 5,801,432 A  9/1998  Rostoker et al.
5,976,912 A  11/1999  Fukutomi et al.
(Continued)

FOREIGN PATENT DOCUMENTS

EP  1966743 B1  2/2011
EP  1958133 B1  3/2011
(Continued)

OTHER PUBLICATIONS

Rogren, Philip E. et al. "A High Performance and Cost Effective Molded Array Package Substrate." (2010).
(Continued)

*Primary Examiner* — Shaun M Campbell
*Assistant Examiner* — Teresa M. Arroyo
(74) *Attorney, Agent, or Firm* — Volpe Koenig

(57) ABSTRACT

Techniques are disclosed herein for forming a dual flat no-leads semiconductor package. The techniques begin with a package assembly that includes multiple non-singulated packages. The semiconductor package assembly includes a lead frame assembly having dies coupled thereto. A mold encapsulation covers at least portions of the dies and exposes a plurality of leads. A first cutting step exposes sidewalls of leads of the lead frame. An electroplating step deposits a plating on the exposed leads. A second cutting step cuts through the mold encapsulation aligned with the step cut sidewalls. A third cutting step perpendicular to the step cuts and is made through the lead frame and mold encapsulation to singulate the dies into individual packages.

19 Claims, 11 Drawing Sheets

(51) Int. Cl.
*H01L 23/31* (2006.01)
*H01L 23/495* (2006.01)

(52) U.S. Cl.
CPC ........ *H01L 23/49541* (2013.01); *H01L 24/97* (2013.01); *H01L 2224/48091* (2013.01); *H01L 2224/48247* (2013.01); *H01L 2224/73265* (2013.01); *H01L 2224/97* (2013.01); *H01L 2924/181* (2013.01)

(58) Field of Classification Search
CPC ... H01L 2224/41111; H01L 2224/0603; H01L 2224/32245; H01L 2224/45099; H01L 2224/48465; H01L 2224/49111; H01L 2224/83; H01L 2224/84; H01L 2224/85; H01L 21/561; H01L 24/97; H01L 24/40; H01L 24/41; H01L 24/48; H01L 24/49; H01L 2224/48091; H01L 2224/48247; H01L 2224/73265; H01L 2224/97; H01L 2224/40247; H01L 2924/181; H01L 2924/00014; H01L 2924/00012; H01L 21/78; H01L 21/4842
See application file for complete search history.

(56) References Cited

U.S. PATENT DOCUMENTS

| | | | |
|---|---|---|---|
| 6,001,671 A | 12/1999 | Fjelstad | |
| 6,219,908 B1 | 4/2001 | Farnworth et al. | |
| 6,238,952 B1 | 5/2001 | Lin | |
| 6,400,004 B1 | 6/2002 | Fan et al. | |
| 6,498,099 B1 | 12/2002 | McLellan et al. | |
| 6,608,366 B1 | 8/2003 | Fogelson et al. | |
| 6,774,659 B1 | 8/2004 | Chiang | |
| 6,872,599 B1 | 3/2005 | Li et al. | |
| 6,888,231 B2 | 5/2005 | Maeda | |
| 6,987,034 B1 | 1/2006 | Chiang | |
| 7,119,421 B2 | 10/2006 | Rohrmoser et al. | |
| 7,183,630 B1 | 2/2007 | Fogelson et al. | |
| 7,645,635 B2 | 1/2010 | Wood et al. | |
| 7,719,094 B2 | 5/2010 | Wu et al. | |
| 7,816,186 B2 | 10/2010 | San Antonio et al. | |
| 7,943,431 B2 | 5/2011 | San Antonio et al. | |
| 8,017,447 B1 | 9/2011 | Olsen | |
| 8,071,427 B2 | 12/2011 | Celaya et al. | |
| 8,076,181 B1 | 12/2011 | Pruitt et al. | |
| 8,093,097 B2 | 1/2012 | Lange et al. | |
| 8,159,826 B2 | 4/2012 | Dijkstra et al. | |
| 8,329,509 B2 | 12/2012 | Gong et al. | |
| 8,395,399 B2 | 3/2013 | Rousseville et al. | |
| 8,436,460 B1 | 5/2013 | Gamboa et al. | |
| 8,437,141 B2 | 5/2013 | Rogy et al. | |
| 8,535,982 B1 | 9/2013 | Abdo et al. | |
| 8,541,786 B2 | 9/2013 | Boomen et al. | |
| 8,642,461 B2 | 2/2014 | Huening | |
| 8,685,795 B2 | 4/2014 | Wang | |
| 8,728,929 B2 | 5/2014 | Van Kempen et al. | |
| 8,809,121 B2 | 8/2014 | Li et al. | |
| 8,968,510 B2 | 3/2015 | Rogy et al. | |
| 9,006,034 B1 | 4/2015 | Sirinorakul | |
| 9,018,537 B2 | 4/2015 | Karrer | |
| 9,070,669 B2 | 6/2015 | Daniels et al. | |
| 9,099,486 B2 | 8/2015 | Merz et al. | |
| 9,153,529 B2 | 10/2015 | Van Kempen et al. | |
| 9,206,794 B2 | 12/2015 | Gridelet | |
| 9,281,284 B2 | 3/2016 | Yap et al. | |
| 9,287,200 B2 | 3/2016 | Higgins, III | |
| 9,324,637 B1 | 4/2016 | Bai et al. | |
| 9,379,071 B2 | 6/2016 | Kamphuis et al. | |
| 9,391,007 B1 | 7/2016 | Yeung et al. | |
| 9,418,919 B2 | 8/2016 | Groenhuis et al. | |
| 9,425,130 B2 | 8/2016 | Leung et al. | |
| 9,443,791 B2 | 9/2016 | Leung et al. | |
| 9,461,009 B1 | 10/2016 | Higgins, III et al. | |
| 9,466,585 B1 | 10/2016 | Kamphuis et al. | |
| 9,472,528 B2 | 10/2016 | Yap | |
| 9,538,659 B2 | 1/2017 | Viswanathan et al. | |
| 9,589,928 B2 | 3/2017 | Bai et al. | |
| 9,606,079 B2 | 3/2017 | Merz | |
| 9,607,918 B2 | 3/2017 | Gong et al. | |
| 9,640,463 B2 | 5/2017 | Lam et al. | |
| 9,673,150 B2 | 6/2017 | Gong et al. | |
| 9,741,692 B2 | 8/2017 | Karhade et al. | |
| 9,779,349 B2 | 10/2017 | Rogy et al. | |
| 9,847,283 B1 | 12/2017 | Ke et al. | |
| 9,935,079 B1 | 4/2018 | Foong et al. | |
| 9,966,326 B2 | 5/2018 | Mustanir et al. | |
| 9,974,174 B1 | 5/2018 | Wenzel et al. | |
| 10,079,198 B1 | 9/2018 | Cadag et al. | |
| 10,083,866 B2 | 9/2018 | Bin Mohd Arshad et al. | |
| 10,199,311 B2 | 2/2019 | Truhitte et al. | |
| 10,410,941 B2 | 9/2019 | Leung et al. | |
| 2002/0063315 A1 | 5/2002 | Huang et al. | |
| 2003/0006055 A1 | 1/2003 | Chien-Hung et al. | |
| 2004/0046240 A1 | 3/2004 | Hasebe et al. | |
| 2005/0023658 A1* | 2/2005 | Tabira | H01L 23/3107 257/E23.044 |
| 2005/0116321 A1 | 6/2005 | Li et al. | |
| 2006/0035414 A1* | 2/2006 | Park | H01L 21/568 438/123 |
| 2007/0126092 A1 | 6/2007 | San Antonio et al. | |
| 2008/0006937 A1 | 1/2008 | Matsunami | |
| 2008/0206588 A1 | 8/2008 | Lange et al. | |
| 2008/0230926 A1 | 9/2008 | Dijkstra et al. | |
| 2008/0246132 A1 | 10/2008 | Kasuya et al. | |
| 2008/0268578 A1 | 10/2008 | Shimanuki et al. | |
| 2008/0308310 A1 | 12/2008 | Rogy et al. | |
| 2008/0309462 A1 | 12/2008 | Rogy et al. | |
| 2009/0079044 A1 | 3/2009 | Wu et al. | |
| 2010/0187663 A1 | 7/2010 | Celaya et al. | |
| 2010/0253372 A1 | 10/2010 | Rousseville et al. | |
| 2011/0033315 A1 | 2/2011 | Gridelet | |
| 2011/0147925 A1 | 6/2011 | Van Kempen et al. | |
| 2011/0244629 A1 | 10/2011 | Gong et al. | |
| 2011/0309514 A1 | 12/2011 | Boomen et al. | |
| 2012/0181678 A1 | 7/2012 | Groenhuis et al. | |
| 2013/0334619 A1 | 12/2013 | Merz et al. | |
| 2013/0334695 A1 | 12/2013 | Tijssen et al. | |
| 2013/0341734 A1 | 12/2013 | Merz | |
| 2014/0167238 A1 | 6/2014 | Jeon et al. | |
| 2014/0357022 A1 | 12/2014 | Stacey | |
| 2015/0035166 A1 | 2/2015 | Letterman, Jr. et al. | |
| 2015/0294924 A1 | 10/2015 | Bai et al. | |
| 2015/0303156 A1 | 10/2015 | Kamphuis et al. | |
| 2016/0005679 A1 | 1/2016 | Israel et al. | |
| 2016/0035651 A1 | 2/2016 | Leung et al. | |
| 2016/0126169 A1* | 5/2016 | Leung | H01L 21/56 438/127 |
| 2016/0181122 A1 | 6/2016 | Eugene Lee et al. | |
| 2016/0218008 A1 | 7/2016 | Li et al. | |
| 2016/0276251 A1 | 9/2016 | Mustanir et al. | |
| 2016/0372403 A1 | 12/2016 | Lam et al. | |
| 2017/0005030 A1 | 1/2017 | Kitnarong et al. | |
| 2017/0133302 A1 | 5/2017 | Truhitte et al. | |
| 2017/0271249 A1 | 9/2017 | Kasuya et al. | |
| 2017/0338170 A1 | 11/2017 | Ziglioli | |
| 2017/0352610 A1* | 12/2017 | Sirinorakul | H01L 23/49548 |
| 2017/0358514 A1 | 12/2017 | Yeung et al. | |
| 2017/0372988 A1 | 12/2017 | Groenhuis et al. | |
| 2018/0033647 A1 | 2/2018 | Bin Mohd Arshad et al. | |
| 2018/0068920 A1 | 3/2018 | Leung et al. | |
| 2018/0102287 A1 | 4/2018 | Santos et al. | |
| 2018/0358286 A1* | 12/2018 | Cadag | H01L 23/49541 |
| 2020/0266172 A1* | 8/2020 | Nishimura | H01L 24/92 |
| 2021/0375641 A1* | 12/2021 | Ding | H01L 21/78 |

FOREIGN PATENT DOCUMENTS

| | | |
|---|---|---|
| EP | 2337068 A1 | 6/2011 |
| EP | 2361000 A1 | 8/2011 |
| EP | 2400534 A1 | 12/2011 |
| EP | 2677540 A1 | 12/2013 |
| EP | 2693465 A1 | 2/2014 |

(56) References Cited

FOREIGN PATENT DOCUMENTS

| | | |
|---|---|---|
| EP | 2677307 B1 | 5/2016 |
| EP | 3051592 A1 | 8/2016 |
| EP | 2677306 B1 | 11/2017 |
| EP | 3261115 A1 | 12/2017 |
| EP | 3293760 A1 | 3/2018 |
| EP | 3306660 A2 | 4/2018 |
| EP | 3319122 B1 | 6/2019 |
| EP | 2704192 B1 | 7/2019 |
| JP | 2014-72236 A | 4/2014 |
| JP | 2016-219520 A | 12/2016 |
| TW | 201019404 A | 5/2010 |
| TW | 201128758 A | 8/2011 |
| TW | 201133655 A | 10/2011 |
| TW | 201803060 A | 1/2018 |
| WO | 2006/134534 A1 | 12/2006 |
| WO | 2007/052234 A2 | 5/2007 |
| WO | 2007/060631 A1 | 5/2007 |
| WO | 2009/072052 A1 | 6/2009 |
| WO | 2009125250 A1 | 10/2009 |
| WO | 2009/133499 A2 | 11/2009 |
| WO | 2009/144672 A1 | 12/2009 |
| WO | 2010/032192 A1 | 3/2010 |
| WO | 2020/185192 A1 | 9/2020 |
| WO | 2020/185193 A1 | 9/2020 |

OTHER PUBLICATIONS

Koschmieder et al., "Soldering the QFN Stacked Die Sensors to a PC Board," Freescale Semiconductor Application Note, AN3111, Rev. 5 (Apr. 2010).

NXP Semiconductors, "Surface Mount Reflow Soldering," Application Note, Rev. 6, AN10365 (Jul. 30, 2012).

Chip Scale Review, The Future of Semiconductor Packaging, vol. 18, No. 6, (Nov.-Dec. 2014).

Janóczki et al., "Automatic Optical Inspection of Soldering," (2013).

Amkor MicroLeadFrame® Data Sheet, DS572S (2017).

Cision PRWeb, "NXP Introduces LIN Transceiver for Smaller, Lighter and More Cost-Efficient ECU Designs," (Feb. 23, 2012).

NXP Semiconductors, TJA1027: Lin 2.2A/SAE J2602 transceiver, Product data sheet, Rev. 2 (Apr. 24, 2013).

J. Ganjei, "Improved QFN Reliability by flank tin plating process after singulation," 2015 10th International Microsystems, Packaging, Assembly and Circuits Technology Conference (IMPACT), 2015, pp. 137-140.

International Preliminary Report on Patentability Chapter I issued Aug. 25, 2021 for PCT International Application No. PCT/US2019/021272.

International Search Report mailed May 14, 2019 for PCT International Application No. PCT/US2019/021272.

* cited by examiner

SEMICONDUCTOR PACKAGE HAVING SIDE WALL PLATING

CROSS REFERENCE TO RELATED APPLICATION(S)

This application is a 371 application of International Application Serial No. PCT/US2019/021272, filed Mar. 8, 2019, the entire contents of which are hereby incorporated by reference as if fully set forth herein.

BACKGROUND

Flat "no-leads' or "leadless" semiconductor packages electrically and physically couple integrated circuit dies (or "dice") to printed circuit boards ("PCB") with flat leads and without through holes extending through a printed circuit board (PCB). Note that although these packages are referred to as "no-leads" or "leadless" packages, the term "leads" in the present disclosure is used to refer to the flat contact pads present on flat no-leads packages. These packages have no "leads" in the sense that there are no leads that extend past or beyond the outer periphery of the package. Flat no-leads packages may be classified as quad flat no-leads ("QFN") packages, having leads on all four sides of the package, and dual flat no-leads ("DFN") packages, having leads on two opposing sides. Within these packages, one or more integrated circuit dies is encapsulated within a non-conductive molding material. An electrically conductive lead frame, typically made of a metal like copper, is electrically coupled to internal components of the package, such as the die, and exposes leads externally that can be electrically coupled to a PCB. Improvements to flat no-leads packages are constantly being made.

Leadless packages have several advantages over packages having leads extending beyond a perimeter of the package. Such packages may have a low profile as compared to other types of packages. Such packages may take up less space and thereby have a smaller "footprint" on a printed circuit board than conventional packages having leads extending beyond the perimeter of the package. Such leadless packages may also have better thermal performance as compared to packages having leads extending beyond the perimeter of the package.

An issue within the relevant industry as it concerns QFN and DFN semiconductor packages relates to the inspection of the solder connections to the leads of the packages. In order to ensure proper solder connections to QFN and DFN semiconductor packages, it is necessary to inspect the connections. These inspections can be performed by x-ray, for example, or by automated optical inspection (AOI). Automated optical inspection (AOI) systems are used to inspect, for example, semiconductor devices and printed circuit boards (PCBs), for defects. QFN and DFN semiconductor packages can allow for AOI, which is less costly than x-ray inspections, if the leads are oriented in such a manner that the portions of the sides or "flanks" of the leads are wettable by solder, such as by having solder wick up the sides or sidewalls of the exposed leads.

There is therefore the need for an efficient method of manufacturing a DFN semiconductor package that provides for wettable flanks that thereby allow AOI to confirm proper solder connections.

SUMMARY

In an aspect of the present invention, a method for fabricating semiconductor packages having step-cut wettable flanks is provided. The method includes making a first series of parallel cuts through plating bars of a package assembly, and partially through a mold encapsulation of the package assembly, wherein the package assembly includes a plurality of die packages organized in rows, each die package having an integrated circuit die and a plurality of leads encapsulated in the mold encapsulation, wherein the die packages are electrically coupled together via the plating bars, and wherein, within each die package, a die paddle is electrically coupled to opposing plating bars via one or both of tie bonds and wire bonds. The method also includes electroplating exposed surfaces of the leads. The method further includes making a second series of parallel cuts aligned with the first series of parallel cuts, fully through the mold encapsulation, thereby forming step-cut wettable flanks. The method also includes making a third series of parallel cuts, perpendicular to the first series of parallel cuts and the second series of parallel cuts, the third series of parallel cuts being made fully through the mold encapsulation and the lead frame.

In another aspect of the invention, a dual flat no-leads ("DFN") semiconductor package fabricated through a method for fabricating semiconductor packages having step-cut wettable flanks is provided. The method includes making a first series of parallel cuts through plating bars of a package assembly, and partially through a mold encapsulation of the package assembly, wherein the package assembly includes a plurality of die packages organized in rows, each die package having an integrated circuit die and a plurality of leads encapsulated in the mold encapsulation, wherein the die packages are electrically coupled together via the plating bars, and wherein, within each die package, a die paddle is electrically coupled to opposing plating bars via one or both of tie bonds and wire bonds. The method further includes electroplating exposed surfaces of the leads. The method also includes making a second series of parallel cuts aligned with the first series of parallel cuts, fully through the mold encapsulation, thereby forming step-cut wettable flanks. The method further includes making a third series of parallel cuts, perpendicular to the first series of parallel cuts and the second series of parallel cuts, the third series of parallel cuts being made fully through the mold encapsulation and the lead frame.

In another aspect of the invention, a dual flat no-leads ("DFN") semiconductor package is provided. The DFN semiconductor package includes a mold encapsulation. The DFN semiconductor package also includes a lead frame at least partially disposed within the mold encapsulation, wherein the lead frame has an integrated circuit die disposed on a die paddle of the lead frame, the lead frame also having one of a tie bar or a wire bond extending from the die paddle to an edge of the mold encapsulation. The DFN semiconductor package also includes a pair of opposing step-cut wettable flanks on opposite sides of the package, exposing sidewalls of leads of the lead frame to be electrolytically plated. The electrolytically plated sidewalls are configured to receive solder for attachment to, for example, a printed circuit board ("PCB").

BRIEF DESCRIPTION OF THE DRAWINGS

A more detailed understanding can be had from the following description, given by way of example in conjunction with the accompanying drawings wherein.

DETAILED DESCRIPTION

Figure 1A:
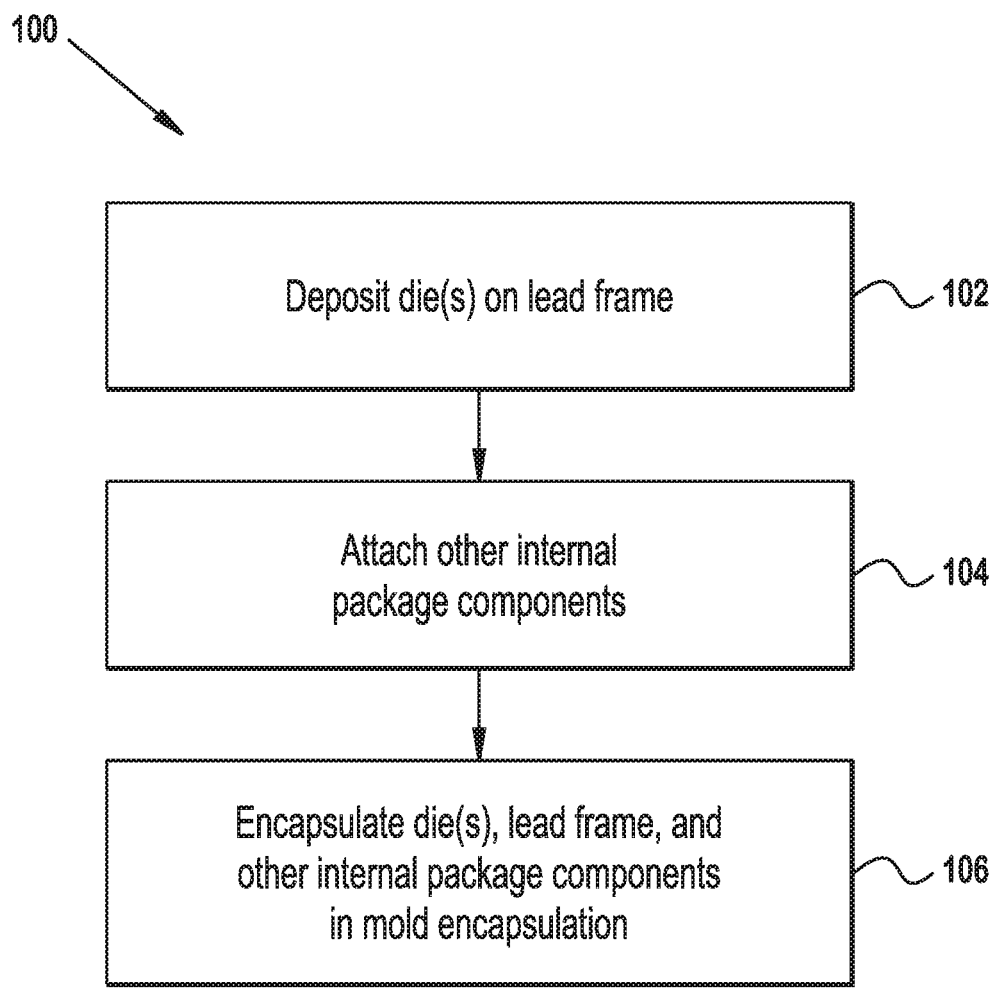
FIG. 1A is a flow diagram of an illustrative method for forming a package assembly, according to an example.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Techniques are disclosed herein for forming wettable flanks on DFN semiconductor packages. The techniques begin with a package assembly that includes multiple non-singulated packages. The package assembly includes a lead frame assembly having dies and other internal package components (such as wire bonds) coupled thereto. The dies and other components form different regions of non-singulated packages. The dies and other components are encapsulated within a non-conductive mold encapsulation material (also referred to as a "molding," "mold," "encapsulation," "encapsulation material," or other similar term herein) that covers most of the package components but may leave exposed certain electrical contact pads (referred to herein as "leads") and, possibly, thermal contact pads (referred to herein as "die paddles"). The lead frame provides a continuous electrical connection between one end of the package assembly and the other, and between the various exposed leads and die paddles of the packages. Elements such as wire bonds or tie bars may assist with forming the electrical connection. This electrical connection is used to allow for current flow during electroplating. At the borders of the regions defining different package dies are plating bars, which are portions of the lead frame assembly that electrically join the different die packages before the die packages are singulated.

A cutting device, such as, for example, as a saw, waterjet cutting device, laser cutting device, or a plasma cutting device, makes step cuts through the lead frame and partially to a depth, but not completely through the molding, to expose certain sidewalls of the leads. Then, at least portions of these exposed sidewalls are electrolytically plated. In addition, bottom surfaces of the leads are electrolytically plated, and bottom surfaces of certain exposed die paddles or contact pads may be electrolytically plated. Within each die package, a die paddle is coupled to right and left plating bars via tie bars or wire bonds to allow for the current flow for electrolytic plating. Subsequently, a cutting device makes cuts fully through the molding, in the same direction and position as the first cuts, to separate the rows of die packages. A third set of cuts is made, perpendicular to the first and second sets of cuts, to singulate the dies. The edges exposed by the third set of cuts are not plated. Thus, a finished semiconductor package may be formed as a DFN semiconductor package.

FIG. 1A is a flow diagram of an illustrative method 100 for forming a package assembly, according to an aspect of the present invention. The method 100 begins at step 102, where one or more dies are deposited onto a lead frame assembly. The lead frame assembly includes multiple package lead frames integrated into a single part or unit. The lead frame assembly may include one or more fiducial marks which are marks detectable by a machine that allow the machine to align itself for cutting. The lead frame assembly may be any metal alloy. Die packages are typically formed in an array of die packages which are then cut ("singulated") into individual die packages. To form this array, a single lead frame assembly is cut from a lead frame material such as a sheet of copper. The lead frame assembly has, integrated therein, multiple lead frame portions corresponding to individual packages. At step 102, one or more of the integrated circuit dies are deposited on the lead frame assembly. At step 104, other components, such as wire bonds, conductive clips (elements within the package that couple the die(s) to one or more leads), or other elements are deposited to form packages. At step 106, a mold encapsulation is deposited around the lead frame and other components of the packages. The mold encapsulation provides a physical and electrical barrier to the components of the package. At the end of method 100 is a package assembly that includes multiple non-singulated package dies with package components (e.g., dies, the lead frame, and the components that couple the dies to the lead frame) encapsulated within a molding material.

Figure 1B:
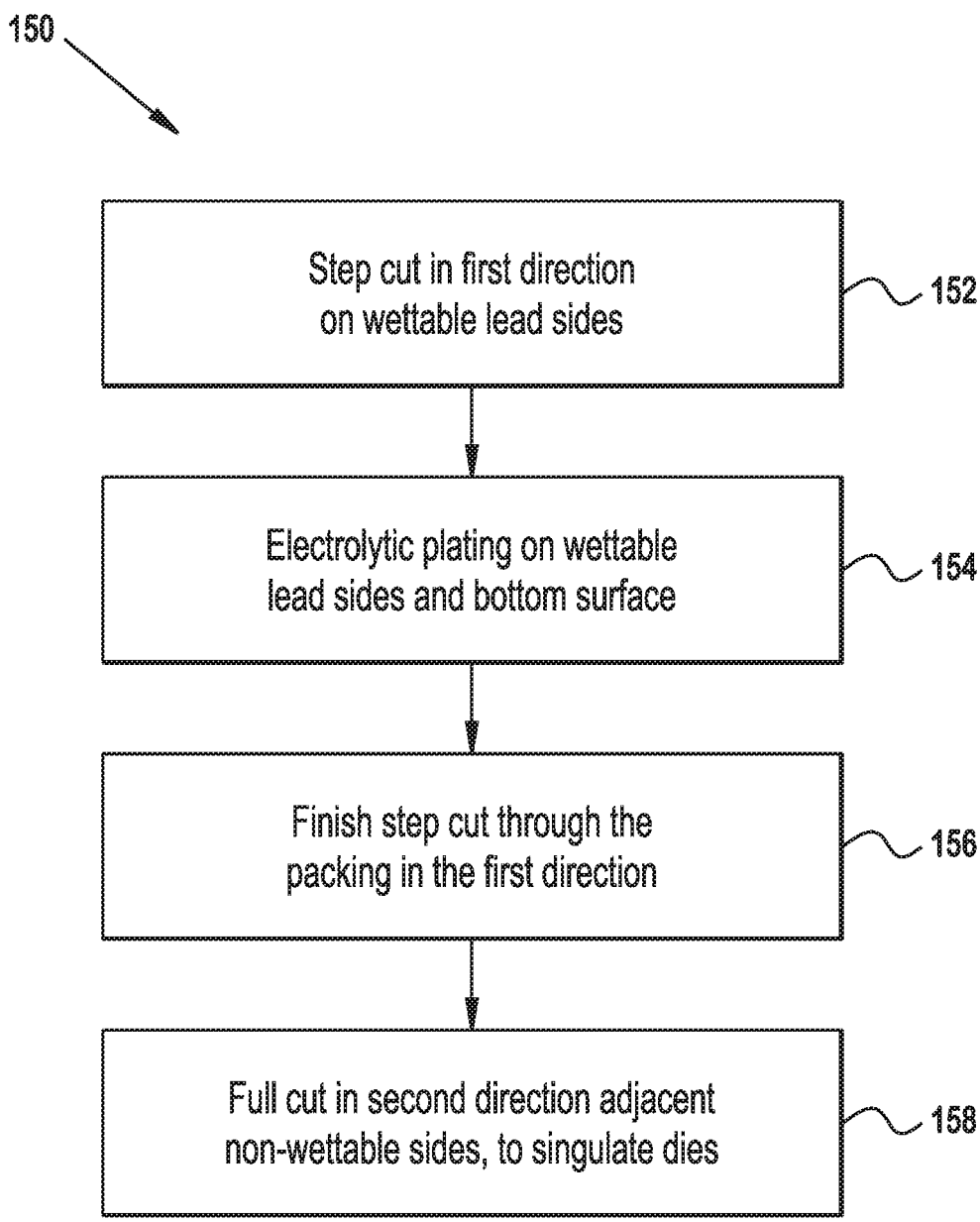
FIG. 1B is a flow diagram of an illustrative method for forming a DFN semiconductor package according to an example.

FIG. 1B is a flow diagram of an illustrative method 100 for forming a DFN semiconductor package according to an aspect of the present invention. The method 150 of FIG. 1B is discussed in conjunction with FIGS. 2A-2E, which illustrate stages of a package assembly 200 as the method 150 proceeds. The method 150 begins with a package assembly 200 (shown in FIG. 2A) that includes a lead frame assembly 205 having an integrated circuit die disposed on and attached thereto. The die is surrounded, at least partially, by an encapsulation material 202. The continuous lead frame assembly 205 includes a plurality of plating bars 203, die paddles 206 (or "pads"), and package edge leads 204, that are fully electrically coupled together in FIG. 2A. The leads 204 are formed from a conductive material and are configured to receive plating, described in further detail herein, in order to function as the solderable contacts for the package to be connected to a printed circuit board. Non-conductive mold encapsulation material 202 surrounds the lead frame assembly 205. The packages are dual flat no-leads ("DFN") packages because the packages have two opposing wettable lead sides 207 that include a plurality of leads 204 for external electrical coupling and two opposing non-wettable sides 209 that do not include leads.

The package assembly 200 includes an array of uncut (or "joined" or "non-singulated") packages 210. The packages include circuitry elements such as integrated circuit dies, conductive elements such as wire bonds, and other elements that are not shown in FIGS. 2A-2E because these figures only show the bottom surface of the package assembly 200 (with the exception of the tie bars 215, 217, and 219, which are not exposed on the bottom surface of the package because these elements are internal to the mold encapsulation 202, but are shown in FIGS. 2A-2E for clarity). More specifically, it should be understood that in the package assembly 200 illustrated, the mold encapsulation 202 has already been deposited around the lead frame 204 and other components and thus what is seen is the mold encapsulation 202 and portions of the lead frame 205 exposed through the mold encapsulation 202. The specific package configuration shown and described in this specification is an example, and details of this configuration should not be taken to be limiting. For example, each package 210 is shown with one die paddle 206, a gate lead 213, and a source lead 211. Thus, in the package 210, a die, which is thermally coupled to the die paddle 206, is electrically coupled to leads 204, and to the gate lead 213 and the source lead 211 via conductive elements internal to the package 210, such as wire bonds. Although a specific number and configuration of leads 204 is shown, the techniques of the present disclosure are applicable to packages 210 having any configuration of leads 204 and/or die paddles 206. For instance, in some packages, a gate lead and/or source lead may not be present. Leads may be present in any configuration. Additionally, any number of dies may be present within the packages, each connected to leads in different configurations.

The plating bars 203 are portions of the lead frame assembly 205 that do not eventually form the lead frame of the individual die packages 210 after the die packages 210 are singulated. In other words, the plating bars 203 provide structural integrity and electrical conductivity across the die packages 210 for electroplating.

Figure 2A:
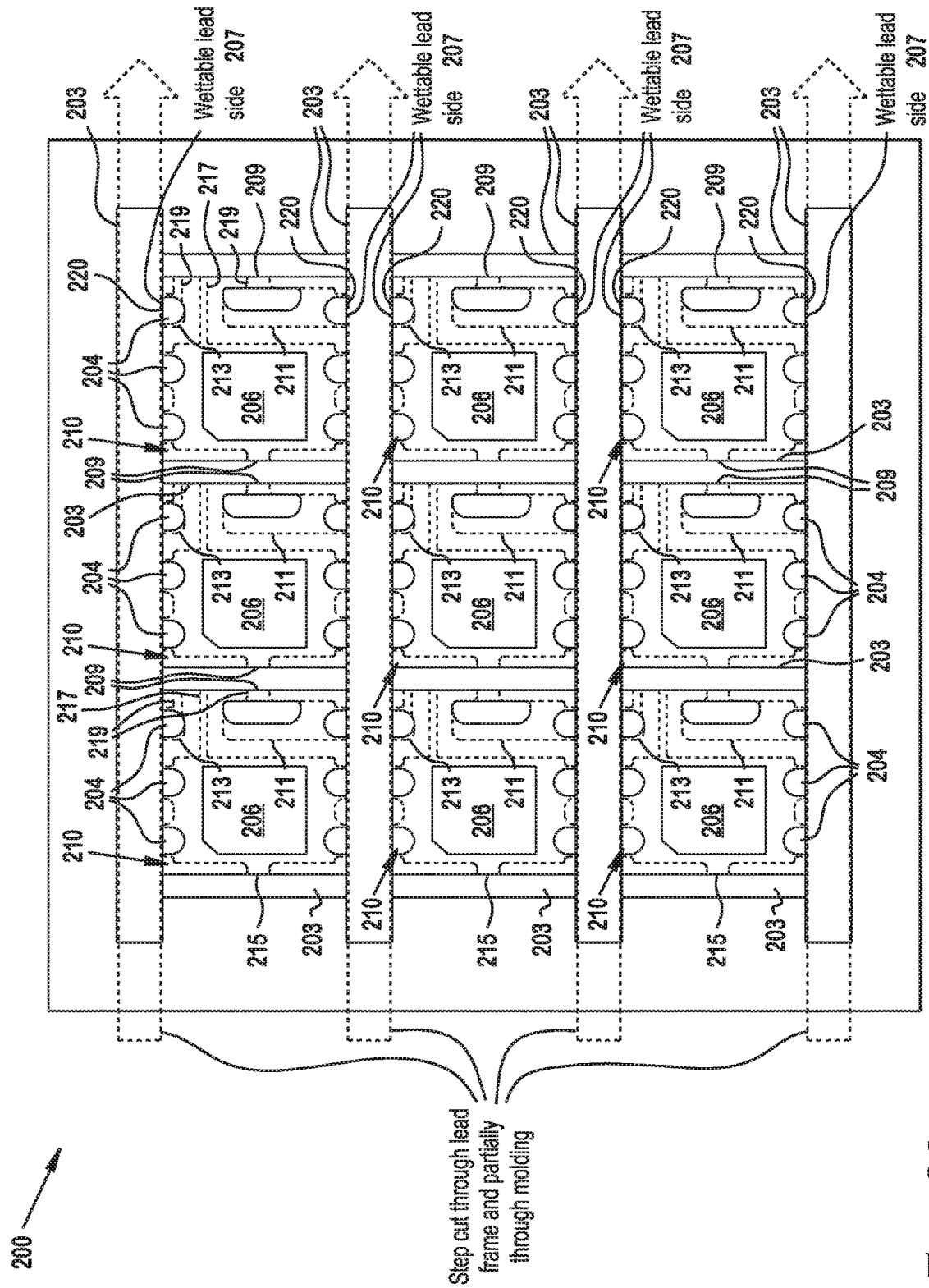
FIG. 2A illustrates a first set of cuts made to a package assembly, according to an example.
Figure 2B:
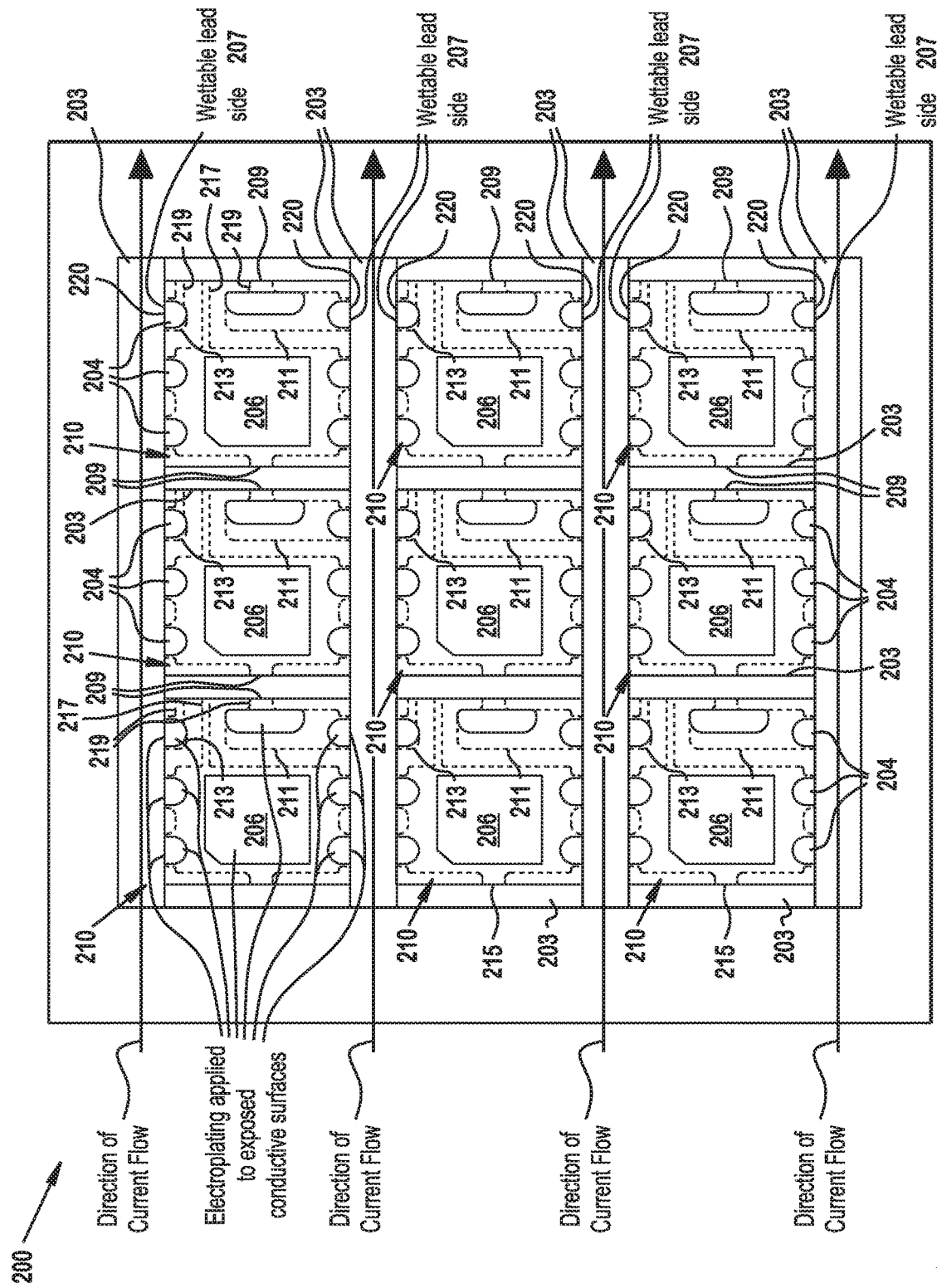
FIG. 2B illustrates electroplating applied to wettable flanks of the package assembly, according to an example.

At step 152, a cutting device performs a first step cut fully through the lead frame 205 and partially through the mold encapsulation 202. This cut is made adjacent to the wettable lead sides 207 of the packages 210, in order to expose sidewalls of the leads 204 for electroplating. The cutting device may be, for example, a saw having a physical blade, a laser cutter, a plasma cutter, or a water jet cutter, or any other acceptable cutting technique as known to those of skill in the art. The cuts may be referred to herein as a first series of parallel cuts. The cutting is illustrated in FIG. 2A. The width of the blade (or other cutting element) used is sufficient to cut the edges of the leads 204 of two adjacent die packages 210. Further, the cut is made fully through the lead frame 205 (specifically, through the horizontal plating bars 203) but not fully through the corresponding mold encapsulation, which allows the package assembly 200 to be handled as a single integrated or joined unit through subsequent steps. The cutting at step 152 forms sidewalls 220 at portions of the leads 204.

At step 154, an electrolytic plating process is performed, using an electrolytic plating device in order to plate the lead frame assembly 205. Lead frames are typically made of a material such as copper. A layer of a metal such as tin or a tin alloy is plated on the surface of the copper to protect from oxidation and to provide a wettable surface for soldering. In a typical electrolytic plating arrangement, the lead frame is clipped in a tin solution and the lead frame is electrically coupled to the cathode of an electrolytic plating device. The anode is coupled to the plating material, which is also clipped in the solution. An electrical current is applied to the lead frame which causes the plating material to be deposited on the surface of the lead frame so that the leads 204 and die paddles 206 are plated with the plating material. In the electrolytic plating technique used for the techniques described herein, a plating material other than tin may be used, such as gold, palladium, or silver. The cuts made at step 152 expose the wettable side-walls 220 of the leads 204 so that electroplating plates the leads 204 with a plating material. The cuts made in step 152 electrically decouple the rows of lead frames, but within each row, there is electrical continuity from left to right as oriented in the Figure. More specifically, in each package 210, current flows from a left plating bar 203, through each elements of the package 210 to be plated, to a right plating bar 203, and then to the next package 210 over, through the shared plating bar 203. Each individual element to be plated in each package 210 is thus electrically coupled to the left and right plating bars 203. Specifically, the die paddle 206 is coupled to a left plating bar 203 through a tie bar 215. A tie bar is a part of the lead frame that provides electrical conductivity and/or structural continuity, between elements in the die package 210 and plating bars 203 or other elements external to the die package 210. In some examples, tie bars are generally thinner than other conductive elements that are part of the lead frame 205 and that extend out of the die package 210, and tie bars typically do not extend to the bottom surface of the die package 210. The die paddle 206 is also electrically coupled to several leads 204. The die paddle 206 is further coupled to the right plating bar 203 through a tie bar 217. The source lead 211 and the gate lead 213 are both coupled to the right plating bar 203 through tie bars 219. Any of the source and gate lead tie bars 219, and the tie bar 217 that couples the die paddle 206 to the right plating bar 203 may be replaced with other conductive elements, such as wire bonds, for the purpose of electrically coupling any of the die paddle 206, the gate lead 213, or the source lead 211 to the right plating bar 203. A wire bond differs from a tie bar in that a wire bond is not a part of the lead frame, but is instead deposited or coupled between portions of the lead frame or components, such as between a die paddle and a lead to provide an electrical connection.

Figure 2C:
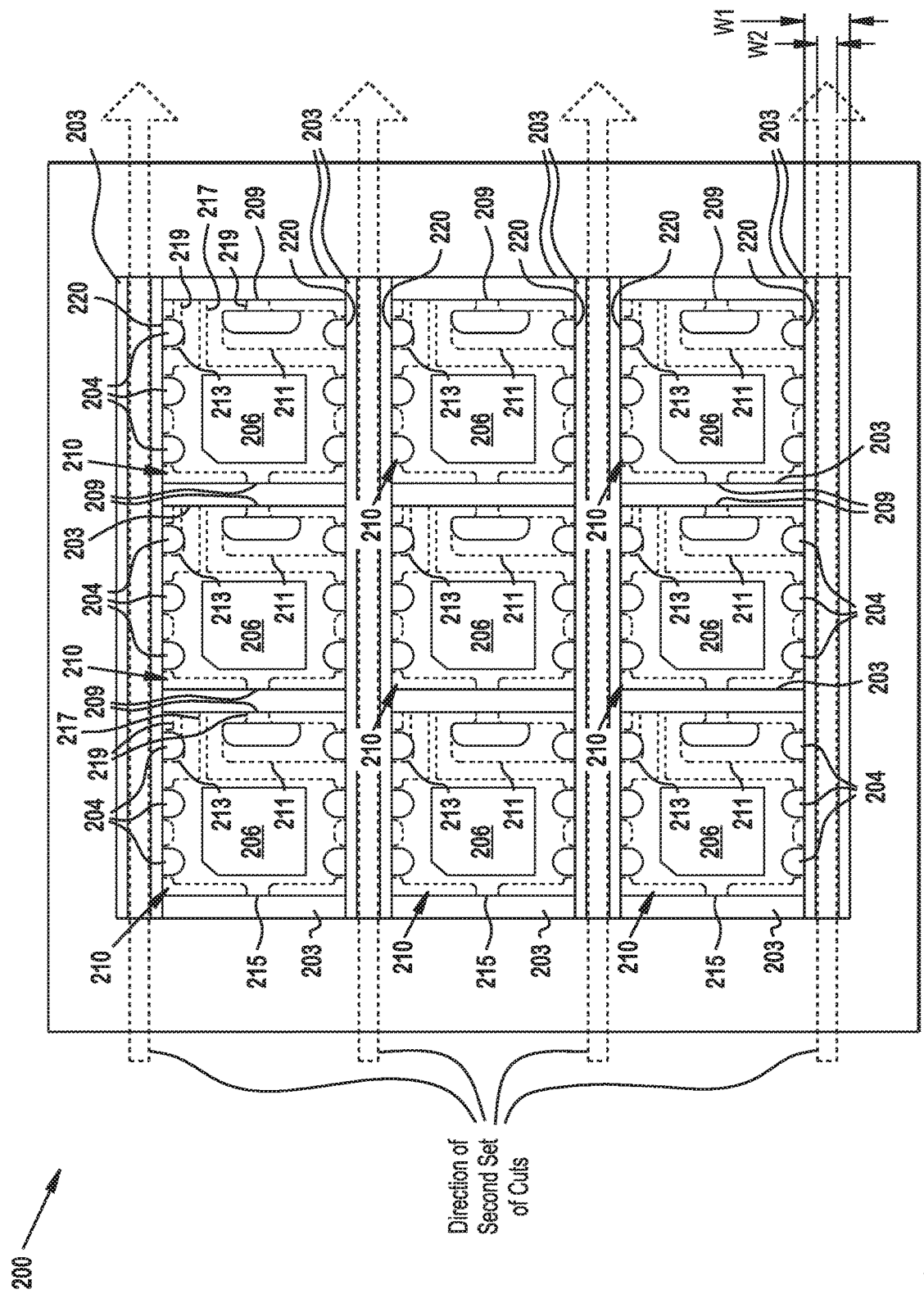
FIG. 2C illustrates a second set of cuts, aligned with the step-cut wettable flanks, made fully through the molding, according to an example.
Figure 2D:
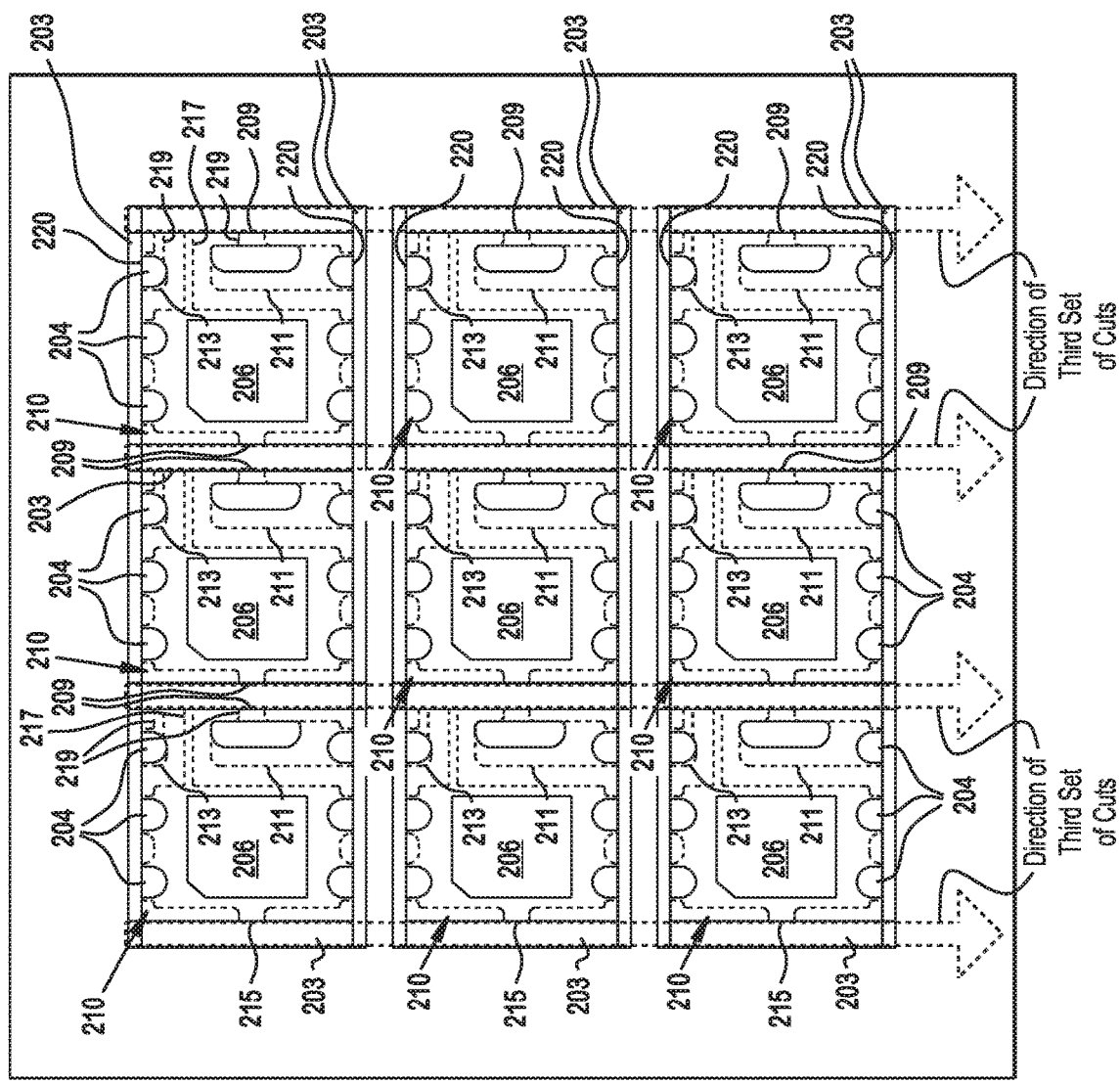
FIG. 2D illustrates third set of cuts, perpendicular to the first and second sets, to singulate the dies, according to an example.

At step 156, a cutting device makes a second set of parallel cuts aligned with the first set of parallel cuts. The width of the second set of parallel cuts is smaller than the width of the first set of cuts made at step 152, as shown in FIG. 2C. These cuts form the step cut wettable flanks of the dies and fully separate the mold encapsulation for the different rows. The step cut wettable flanks are step cut sides that expose sidewalls of the leads for application of solder so that they can be inspected such as via AOI. The two widths of the step cuts are shown in FIG. 2C as width 1 (W1) and width 2 (W2), with W1 being greater than W2.

Figure 2E:
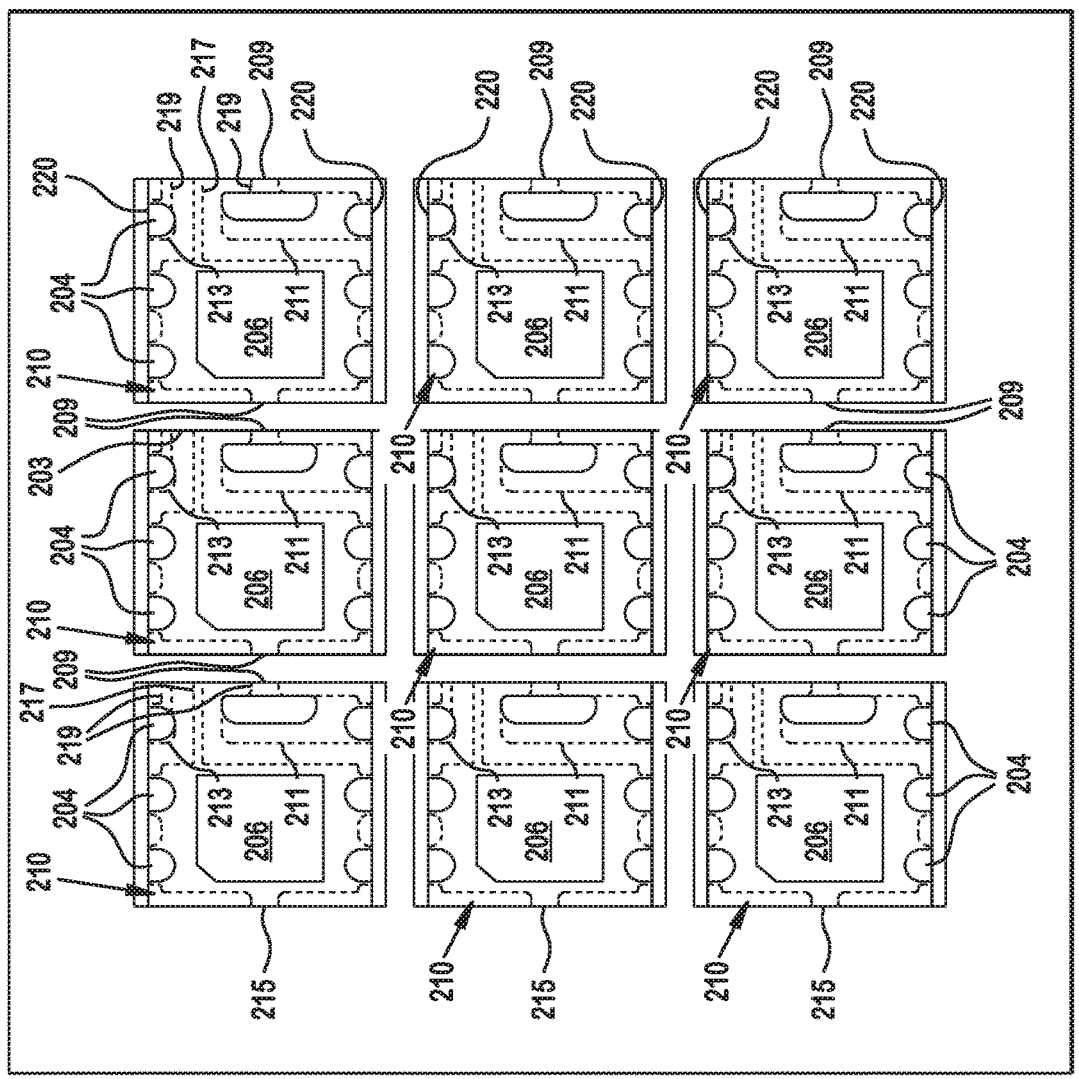
FIG. 2E illustrates singulated dies having wettable flanks, according to an example.

At step 158, a cutting device makes a third set of parallel cuts that are perpendicular to the first and second sets of parallel cuts. The third set of parallel cuts are aligned to cut through the plating bars 203, in order to singulate the dies 210. The third set of parallel cuts are made deep enough to fully cut through the lead frame 205 and the mold encapsulation 202. FIG. 2E illustrates the singulated packages 210 having wettable flanks.

Figure 3A:
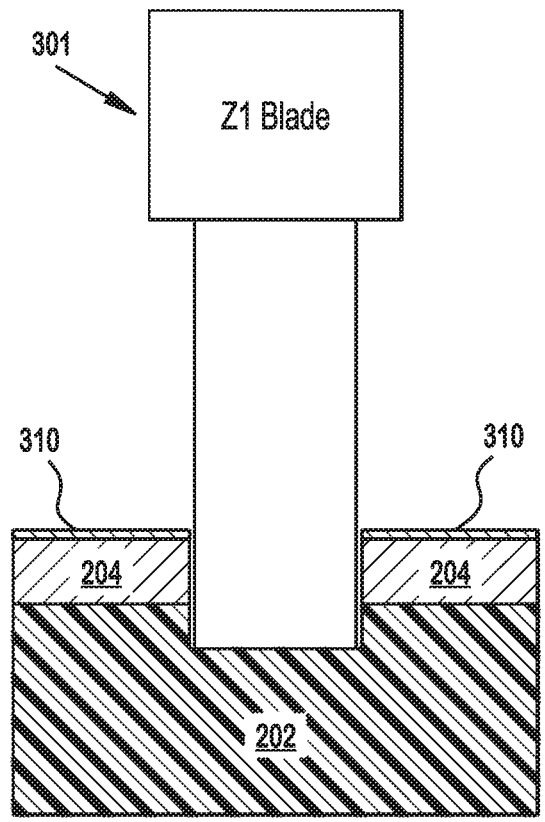
FIG. 3A is a cross-sectional view illustrating the first series of cuts of FIG. 2A, according to an example.
Figure 3B:
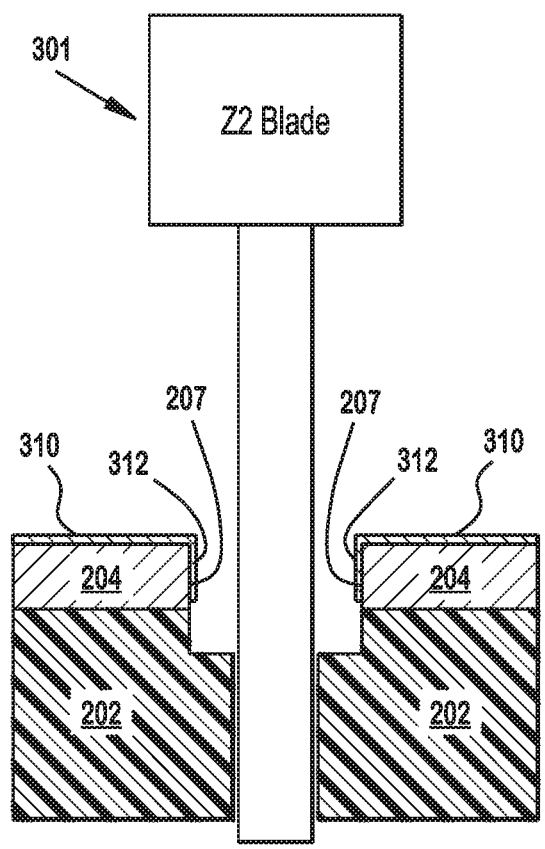
FIG. 3B is a cross-sectional view illustrating the second series of cuts of FIG. 2C, according to an example.

FIGS. 3A-3B illustrate details related to steps 152 and 156. A cutter 301 is shown in both figures. FIG. 3A illustrates an example of the step cut partially fully through the lead frame and partially through the molding as described in step 152 and as shown in FIG. 2A. The cut shown in FIG. 3A is made at a first thickness configured to expose the sidewalls of the leads 204 of the packages 210. The cut is shown in FIG. 3A as being made with a saw blade having a thickness labeled "Z1," but any technically feasible means for making the cut could be used, such as, for example, a laser cutter, a plasma cutter, or a water jet cutter, or any other acceptable cutting technique as known to those of skill in the art.

FIG. 3B illustrates an example of the second step cut, which is fully through the encapsulation material that remains after the step cuts of step 152 and FIG. 2A. The leads 204 have a plating material 310 deposited thereon via electrolytic plating to form step-cut wettable flanks 312.

Figure 4A:
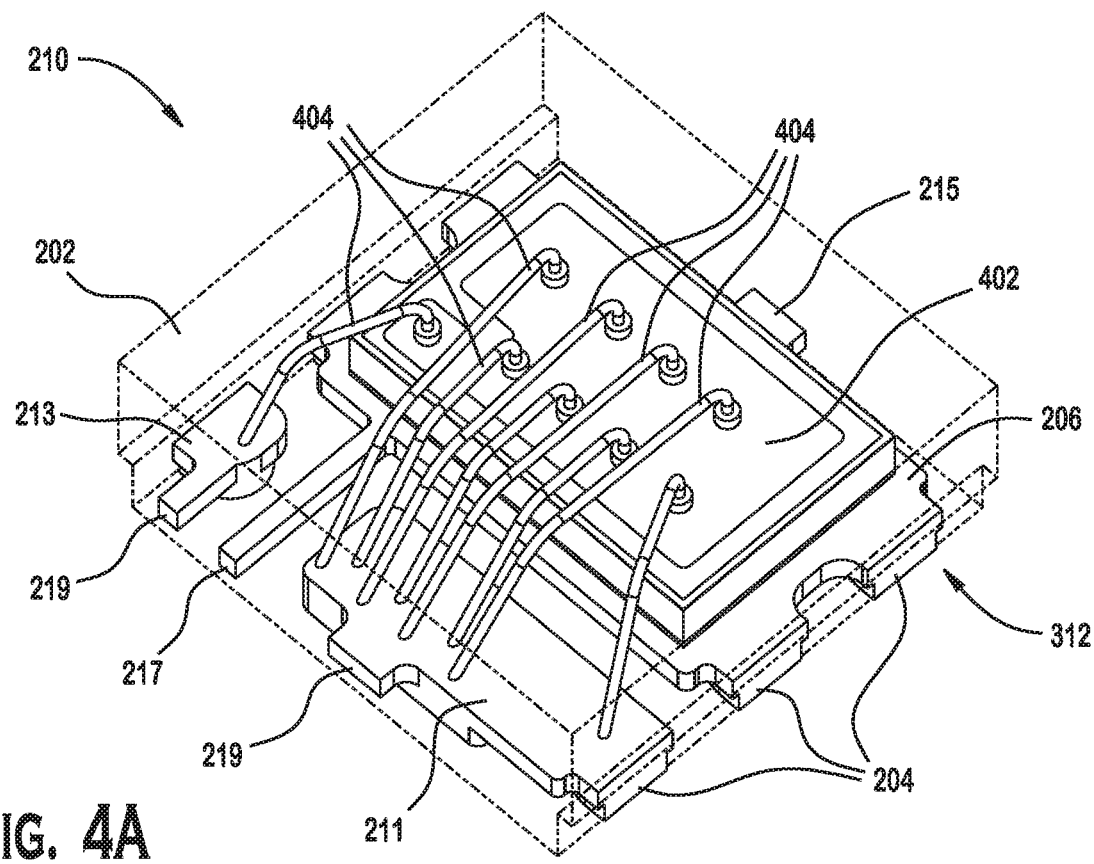
FIG. 4A illustrates a top orthographic view of a singulated die having wettable flanks, according to an example.
Figure 4B:
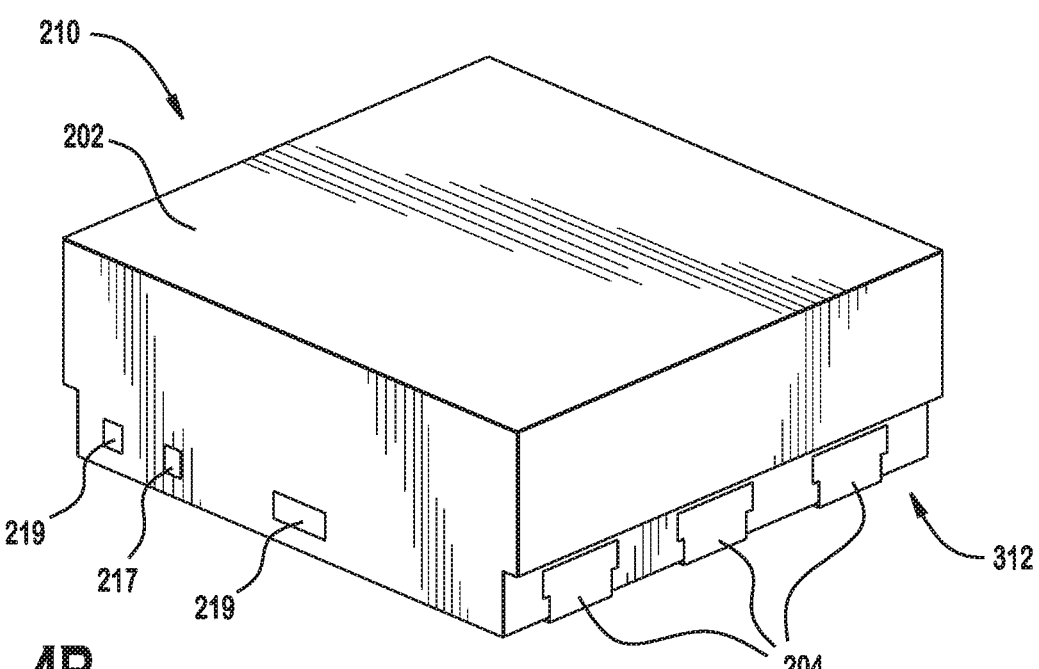
FIG. 4B illustrates a transparent top orthographic view of a singulated die having wettable flanks, according to an example.
Figure 4C:
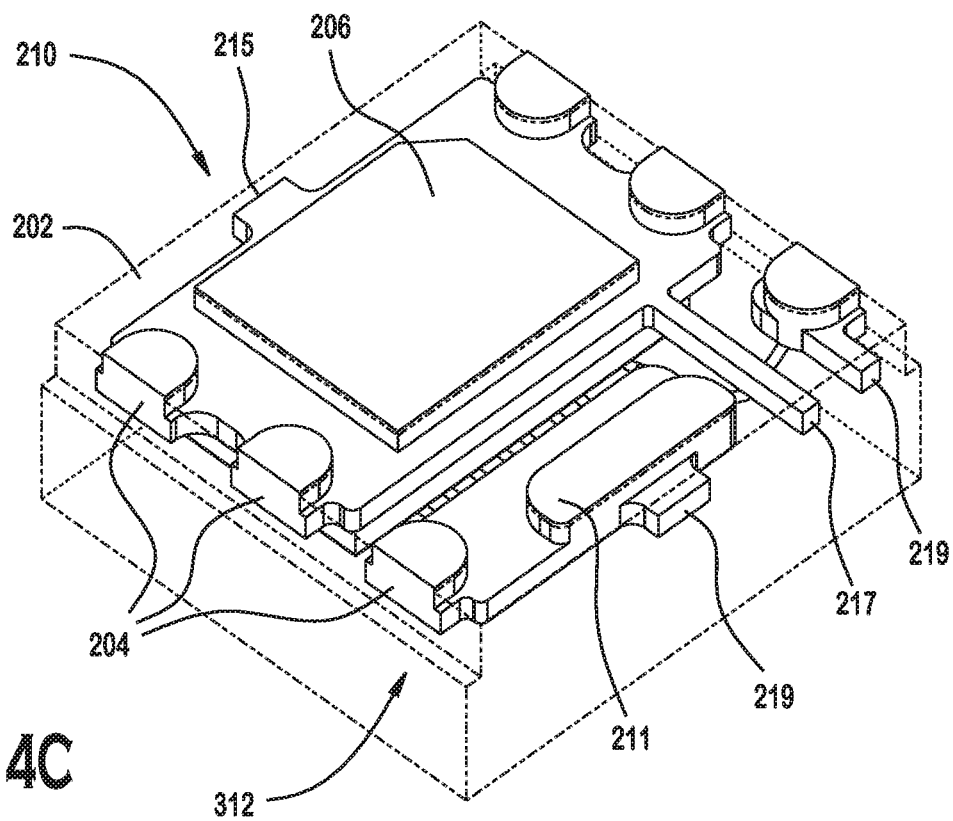
FIG. 4C illustrates a bottom orthographic view of a singulated die having wettable flanks, according to an example.
Figure 4D:
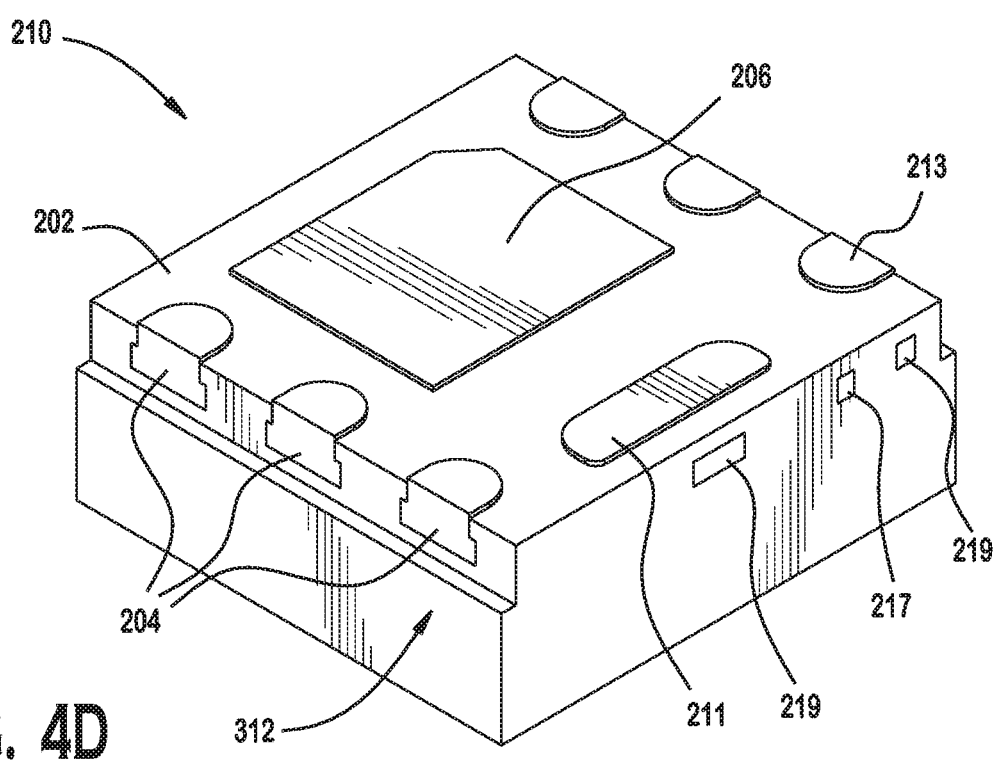
FIG. 4D illustrates a transparent bottom orthographic view of a singulated die having wettable flanks, according to an example.

FIGS. 4A-4D illustrate different views of a singulated die package 210, illustrating the step-cut wettable flanks formed according to the method 150 of FIG. 1B. FIGS. 4A and 4B illustrate orthographic views, illustrating the top and sides of the package 210 and FIGS. 4C and 4D illustrate orthographic views, illustrating the bottom and sides of the package 210.

Referring to FIGS. 4A-4D together, the package 210 depicted includes a mold encapsulation 202 and has step-cut wettable flanks 312 with electrolytic plating formed on the leads 204 of two opposing sides in accordance with the technique described in FIG. 1B. The step-cut wettable flanks 312 include the portions of the die package 210 at which the step cuts of steps 152 and 156 are made and also include the leads 204 that are electrolytically plated. Edges of tie bars 215, 217, and 219, electrically coupled to portions of the lead frame 205 internal to the mold encapsulation 202 are revealed in the non-plated sides of the package 210. FIGS. 3C and 3D illustrate the bottom surfaces of the leads 204 and die paddles 206, which, as described elsewhere herein, are electrolytically plated.

Internally, the illustrated package 210 includes a die 402. The die 402 is mounted on, and thermally coupled to die paddle 206, which is a part of the lead frame 205. Wire bonds couple the die 404 to the leads 204 of the lead frame 205. The source lead 211 and gate lead 213 are coupled to the die 402 via wire bonds 404. Further, the source lead 211 is coupled to a tie bar 219, which is not plated and is not functional in the finished package, but is used for the purpose of maintaining electrical continuity between die packages for electroplating as described with respect to FIGS. 1B and 2A-2E. The gate lead 213 is coupled to a tie bar 219, which is also not plated and serves a similar function as the tie bar 219 for the source lead 211. The die paddle 206 is coupled to a tie bar 217 which also serves no purpose in the finished package and is not plated, but is used during electroplating to make the full electrical connection across the different die packages. A tie bar 215 is present on an opposing side and is coupled to the die paddle 206. The tie bar 215 serves a similar purpose to the other tie bars and is not plated.

Figure 5:
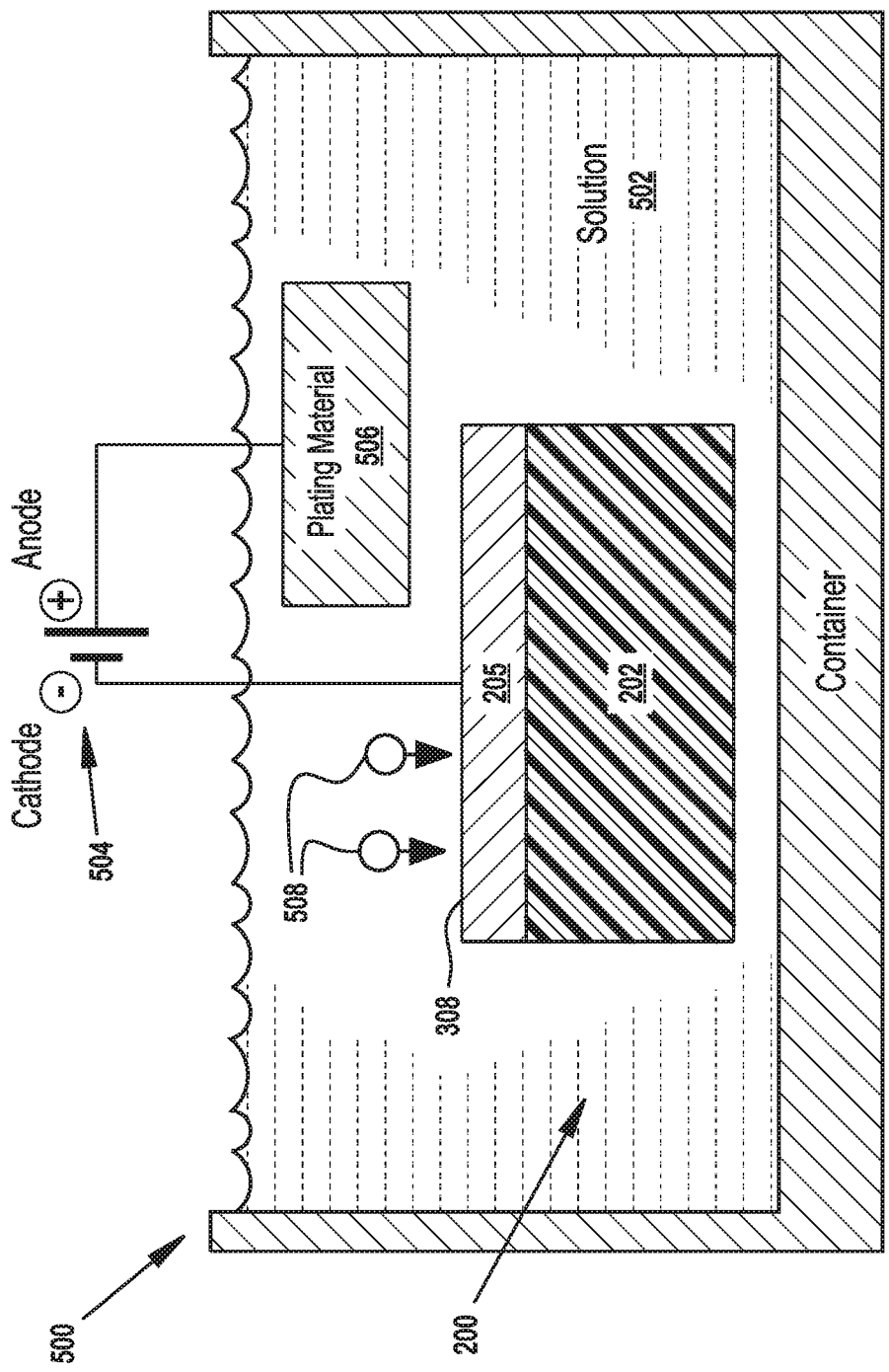
FIG. 5 illustrates an electrolytic plating technique, according to an example.

FIG. 5 illustrates an illustrative electrolytic plating technique. Such a technique could be used for example as part of step 104, illustrated in FIG. 2B. According to the technique, in an electroplating device 500, the package assembly 200 (only a part of which is shown in FIG. 5) is placed into a solution 502. The cathode of a power source 504 is electrically coupled to the lead frame 205 and the anode of the power source 504 is coupled to a plating material 506. When current is applied by the power source 504, plating material 508 is deposited onto the exposed surfaces of the lead frame 205.

It will be appreciated that the foregoing is presented by way of illustration only and not by way of any limitation. It is contemplated that various alternatives and modifications may be made to the described embodiments without departing from the spirit and scope of the invention. Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method for fabricating a semiconductor package, the method comprising:
    providing a lead frame assembly, the lead frame assembly comprising:
        a plurality of plating bars, the plurality of plating bars comprising a first set of plating bars spaced apart from each other and extending in a first direction, and a second set of plating bars spaced apart from each other and extending in a second direction generally perpendicular to the first direction, and
        a plurality of die packages organized in rows with each die package having an integrated circuit die, each die package of the plurality of die packages having a bottom surface, a first side and an opposite second side, a third side and an opposite fourth side,
        each die package of the plurality of die packages positioned between, attached to and electrically coupled to a plating bar of the first set of plating bars adjacent the first side of the die package and an opposing plating bar of the first set of plating bars adjacent the second side of the die package, each die package of the plurality of die packages positioned between, attached to and electrically coupled to a plating bar of the second set of plating bars adjacent the third side and an opposing plating bar of the second set of plating bars adjacent the fourth side;
        each die package of the plurality of die packages comprising:
            a die paddle electrically coupled via a single first tie bar to a respective one of the plating bars of the first set of plating bars adjacent the first side of the die package, and electrically coupled via a single second tie bar to an opposing respective one of the plating bars of the first set of plating bars adjacent the second side of the die package;

a plurality of leads, each of the plurality of leads having a sidewall and a bottom surface, at least some of the plurality of leads extending from and electrically coupled to the die paddle, at least one lead of the plurality of leads being spaced apart from the die paddle and electrically coupled to the respective plating bar of the first set of plating bars adjacent the second side of the die package via a single third tie bar;

encapsulating at least portions of the lead frame assembly with a mold encapsulation while leaving exposed bottom surfaces of the plurality of leads and bottom surfaces of the die paddles, the lead frame assembly and mold encapsulation forming a package assembly;

making a first series of parallel cuts completely through the second set of plating bars of the package assembly and partially through the mold encapsulation of the package assembly to create exposed portions of surfaces of sidewalls of the plurality of leads;

electroplating at least portions of the exposed portions of the surfaces of the sidewalls of the plurality of leads;

making a second series of parallel cuts aligned with the first series of parallel cuts, fully through the mold encapsulation, a width of the second series of parallel cuts smaller than a width of the first series of parallel cuts, thereby forming step-cut wettable sides; and making a third series of parallel cuts fully through the mold encapsulation and the first set of plating bars, perpendicular to the first series of parallel cuts and the second series of parallel cuts.

2. The method of claim 1, wherein a first set of leads of the plurality of leads are positioned adjacent the third side of a respective die package of the plurality of die packages, and wherein a second set of leads of the plurality of leads are positioned adjacent the fourth side of a respective die package of the plurality of die packages.

3. The method of claim 2, wherein sidewalls of the first set of leads are aligned with each other along a facing surface of a respective plating bar of the second set of plating bars adjacent the third side of a respective die package, and wherein sidewalls of the second set of leads are aligned with each other along a facing surface of a respective plating bar of the second set of plating bars adjacent the fourth side of the respective die package.

4. The method of claim 1, wherein the at least one lead of the plurality of leads spaced apart from the die paddle comprises a gate lead.

5. The method of claim 4, wherein at least one lead of the plurality of leads comprises a source lead, the source lead spaced apart from the die paddle and the gate lead and electrically coupled to a same respective plating bar as the gate lead via a single fourth tie bar.

6. The method of claim 5, wherein the second tie bar extends between the gate lead and the source lead.

7. The method of claim 1, further comprising:
electroplating the exposed bottom surfaces of the die paddles, and electroplating the exposed bottom surfaces of the plurality of leads.

8. The method of claim 1, wherein the first side of each of the die packages of the plurality of die packages and the second side of each of the die packages of the plurality of die packages are not electrolytically plated.

9. The method of claim 1, wherein the first tie bar has a diameter greater than a diameter of the second tie bar.

10. A method for fabricating a semiconductor package, the method comprising:
providing a die package comprising a die paddle and a plurality of leads, the die paddle and the plurality of leads having bottom surfaces, each of the plurality of leads having a sidewall, wherein at least some of the plurality of leads extend from the die paddle and are electrically coupled to the die paddle, and wherein at least one lead of the plurality of leads is spaced apart from the die paddle;

providing a plurality of plating bars surrounding, attached to and electrically coupled to the die package, the plurality of plating bars comprising a first set of plating bars spaced apart from each other and extending in a first direction, and a second set of plating bars spaced apart from each other and extending in a second direction perpendicular to the first direction;

electrically coupling a first side of the die paddle to one of the plurality of plating bars of the first set of plating bars via a single first tie bar;

electrically coupling an opposite second side of the die paddle to a different one of the plurality of plating bars of the first set of plating bars via a single second tie bar;

electrically coupling the at least one lead of the plurality of leads that is spaced apart from the die paddle to one of the plurality of plating bars of the first set of plating bars via a single third tie bar;

encapsulating at least portions of the die package and at least portions of the plurality of plating bars with a mold encapsulation while leaving exposed the bottom surfaces of the plurality of leads and the bottom surface of the die paddle;

making a first series of parallel cuts through the second set of plating bars of the plurality of plating bars, and partially through the mold encapsulation to create exposed portions of surfaces of sidewalls of the plurality of leads;

electroplating at least portions of the exposed portions of the surfaces of the sidewalls of the plurality of leads;

making a second series of parallel cuts aligned with the first series of parallel cuts, fully through the mold encapsulation, a width of the second series of parallel cuts being smaller than a width of the first series of parallel cuts, thereby forming step-cut wettable sides; and making a third series of parallel cuts, perpendicular to the first series of parallel cuts and the second series of parallel cuts, the third series of parallel cuts being made fully through the mold encapsulation and the first set of plating bars of the plurality of plating bars.

11. The method of claim 10, wherein the at least one lead of the plurality of leads spaced apart from the die paddle comprises a gate lead.

12. The method of claim 11, wherein at least one lead of the plurality of leads comprises a source lead, the source lead spaced apart from the die paddle and the gate lead and electrically coupled to a same respective plating bar as the gate lead via a single fourth tie bar.

13. The method of claim 12, wherein the second tie bar extends between the gate lead and the source lead.

14. The method of claim 10, wherein the first side of the die package of and the second side of the die package are not electrolytically plated.

15. The method of claim 10, wherein the first tie bar has a diameter greater than a diameter of the second tie bar.

16. The method of claim 10, wherein a first set of leads of the plurality of leads is positioned adjacent a plating bar of the second set of plating bars, and wherein an opposite second set of leads of the plurality of leads is positioned adjacent a different plating bar of the second set of plating bars.

17. The method of claim 16, wherein sidewalls of the first set of leads are aligned with each other along a facing surface of a respective plating bar of the second set of plating bars, and wherein sidewalls of the second set of leads are aligned with each other along a facing surface of a respective plating bar of the second set of plating bars.

18. The method of claim 10, wherein the plurality of leads comprise copper and the electroplating plates the plurality of leads with tin.

19. A dual flat no-leads ("DFN") semiconductor package made according to the method of claim 10.

* * * * *